(12) United States Patent
Lin et al.

(10) Patent No.: US 11,437,101 B2
(45) Date of Patent: Sep. 6, 2022

(54) RESISTIVE MEMORY STORAGE APPARATUS AND OPERATING METHOD THEREOF

(71) Applicant: Winbond Electronics Corp., Taichung (TW)

(72) Inventors: Lih-Wei Lin, Taichung (TW); Lung-Chi Cheng, Taichung (TW); Ju-Chieh Cheng, Taichung (TW); Ying-Shan Kuo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/226,052

(22) Filed: Apr. 8, 2021

(65) Prior Publication Data

US 2021/0335421 A1 Oct. 28, 2021

(30) Foreign Application Priority Data

Apr. 24, 2020 (TW) .................... 109113857

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/0061* (2013.01); *G11C 2013/0078* (2013.01)

(58) Field of Classification Search
CPC .............. G11C 13/0069; G11C 13/003; G11C 13/0061

(Continued)

(56) References Cited

U.S. PATENT DOCUMENTS 7,924,601 B2  4/2011  Aoki
9,691,478 B1  6/2017  Lin et al.
(Continued)

FOREIGN PATENT DOCUMENTS

TW    I482155      4/2015
WO    2018136187   7/2018

OTHER PUBLICATIONS

"Office Action of Taiwan Counterpart Application", dated May 24, 2021, p. 1-p. 4.

(Continued)

*Primary Examiner* — Vu A Le
(74) *Attorney, Agent, or Firm* — JCIPRNET

(57) ABSTRACT

A resistive memory storage apparatus including a memory cell, a selecting transistor and a memory controller is provided. The memory cell outputs a writing current during a writing pulse width period. The selecting transistor is coupled to the memory cell. The memory controller is coupled to the selecting transistor and the memory cell. The memory controller is configured to apply a control voltage that gradually changes to a predetermined voltage level to a control end of the selecting transistor during a resistance transition phase of the writing pulse width period and set the control voltage to the predetermined voltage level during a filament stabilization phase after the resistance transition phase, so as to limit the writing current to a predetermined current value. In addition, an operating method for a resistive memory storage apparatus is also provided.

17 Claims, 8 Drawing Sheets

During the first resistance transition phase of the writing pulse width period, providing the control voltage V1 which gradually changes to the first voltage level L1 to the control end of the first selecting transistor T1, and during the subsequent first filament stabilization phase, providing the fixed first voltage level L1 to the control end of the first selecting transistor T1, so that the writing current Id is limited to the first predetermined current value Iref1 — S100

During the second resistance transition phase of the writing pulse width period, providing the control voltage V1 which gradually changes to the second voltage level L2 to the control end of the first selecting transistor T1, and during the subsequent second filament stabilization phase, providing the fixed second voltage level L2 to the control end of the first selecting transistor T1, so that the writing current Id is limited to the second predetermined current value Iref2 — S110

(58) Field of Classification Search
USPC .......................................................... 365/148
See application file for complete search history.

(56) References Cited

U.S. PATENT DOCUMENTS

| | | |
|---|---|---|
| 2005/0117388 A1* | 6/2005 | Cho .................. G11C 13/0004 365/163 |
| 2008/0144356 A1 | 6/2008 | Oh et al. |
| 2008/0170428 A1* | 7/2008 | Kinoshita ........... H01L 27/2472 257/E21.664 |
| 2011/0075468 A1 | 3/2011 | Scheuerlein et al. |
| 2012/0314481 A1 | 12/2012 | Close et al. |
| 2014/0003130 A1 | 1/2014 | Ichihara et al. |
| 2016/0148681 A1 | 5/2016 | Bukethal |
| 2019/0371399 A1 | 12/2019 | Haukness et al. |

OTHER PUBLICATIONS

"Search Report of Europe Counterpart Application", dated Sep. 8, 2021, p. 1-p. 9.
"Office Action of Korea Counterpart Application", with English translation thereof, dated Jun. 22, 2022, p. 1-p. 8.

* cited by examiner

During the first resistance transition phase of the writing pulse width period, providing the control voltage V1 which gradually changes to the first voltage level L1 to the control end of the first selecting transistor T1, and during the subsequent first filament stabilization phase, providing the fixed first voltage level L1 to the control end of the first selecting transistor T1, so that the writing current Id is limited to the first predetermined current value Iref1 ～S100

During the second resistance transition phase of the writing pulse width period, providing the control voltage V1 which gradually changes to the second voltage level L2 to the control end of the first selecting transistor T1, and during the subsequent second filament stabilization phase, providing the fixed second voltage level L2 to the control end of the first selecting transistor T1, so that the writing current Id is limited to the second predetermined current value Iref2 ～S110

FIG. 7

RESISTIVE MEMORY STORAGE APPARATUS AND OPERATING METHOD THEREOF

CROSS-REFERENCE TO RELATED APPLICATION

This application claims the priority benefit of Taiwan application serial no. 109113857, filed on Apr. 24, 2020. The entirety of the above-mentioned patent application is hereby incorporated by reference herein and made a part of this specification.

BACKGROUND

1. Technical Field

The disclosure relates to a memory storage apparatus and an operating method thereof, and more particularly, to a resistive memory storage apparatus and an operating method thereof.

2. Description of Related Art

The resistive memory (e.g. resistive random access memory (RRAM)) is advantageous in low power consumption, high-speed operation, high density and compatibility with the complementary metal oxide semiconductor (CMOS), and therefore is an adequate choice for the next generation non-volatile memory device.

Current resistive memory includes an upper electrode and a lower electrode disposed opposite to each other and a dielectric layer between the upper electrode and the lower electrode. Before the resistive memory of the related art is repeatedly switched between a high resistance state (HRS) and a low resistance state (LRS) to memorize data, a channel forming operation is required. The forming operation includes applying a bias voltage (e.g. a positive bias) to the resistive memory, such that a current is generated and flows from the upper electrode to the lower electrode. As a result, oxygen vacancies and oxygen ions are generated in the dielectric layer to form a current path, and the resistive memory is switched from the HRS to the LRS to form a conductive filament. Generally, in the formed filament, the diameter of the portion adjacent to the upper electrode is smaller than the diameter of the portion adjacent to the lower electrode. After that, the resistive memory can be reset to the HRS, or can be set to the LRS, to complete the data memorization. In addition, when the resistive memory of the related art is reset, a bias voltage with polarity opposite to the polarity of a setting bias voltage is applied to the resistive memory, such that a current flows from the lower electrode to the upper electrode. In such a situation, the oxygen vacancies adjacent to the upper electrode combine with partial oxygen ions, which interrupts the current path. As a result, the filament is cut off at the portion adjacent to the upper electrode. When the resistive memory of the related art is set, the setting bias voltage with polarity identical to the polarity of the bias voltage of the forming operation is applied to the resistive memory, such that a current flows from the upper electrode to the lower electrode. In such a situation, the oxygen ions adjacent to the upper electrode are detached from the oxygen vacancies, and oxygen vacancies are reformed, such that the filament is reformed at the portion adjacent to the upper electrode.

However, according to the resistive memory of the related art, during the forming operation or the setting operation of the resistive memory, a verification operation is required after applying the forming bias voltage or the setting bias voltage. The verification operation includes discharging and applying a verification voltage, and includes charging and providing the forming bias voltage or the setting bias voltage again when the verification fails. Therefore, the execution time of the forming operation or the setting operation is significantly long. In addition, according to the resistive memory of the related art, after the forming operation or the setting operation of the resistive memory, the cell current distribution is uneven since the cell variations occur during the manufacturing process, which results in a high bit error rate (BER).

SUMMARY

The disclosure provides a resistive memory storage apparatus and an operating method thereof, which can effectively reduce the bit error rate (BER).

According to the disclosure, a resistive memory storage apparatus includes a memory array, a first selecting transistor and a memory controller. The memory array includes multiple memory cells, each of which outputs a writing current during a writing pulse width period. The first selecting transistor is coupled to the memory cells. The memory controller is coupled to the first selecting transistor and the memory cells. The memory controller is utilized for applying a first control voltage gradually changing to a first voltage level according to the writing current to a control end of the first selecting transistor during a first resistance transition phase of the writing pulse width period, and is utilized for setting the first control voltage to the first voltage level during a first filament stabilization phase after the first resistance transition phase, so as to limit the writing current to a first predetermined current value.

According to the disclosure, an operating method for a resistive memory storage apparatus includes: during a writing pulse width period, reading a writing current from one of multiple memory cells, wherein the writing pulse width period includes a first resistance transition phase, a first filament stabilization phase, a second resistance transition phase and the second filament stabilization phase; during the first resistance transition phase, providing a control end of the first selecting transistor with a control voltage gradually changing to a first voltage level according to the writing current to provide the writing current to one of the memory cells; during the first filament stabilization phase after the first resistance transition phase, providing the control end of the first selecting transistor with the control voltage fixed to the first voltage level to limit the writing current to a first predetermined current value; during the second resistance transition phase after the first filament stabilization phase, providing the control end of the first selecting transistor with the control voltage gradually changing to a second voltage level greater than the first voltage level according to the writing current; and during the second filament stabilization phase after the second resistance transition phase, providing the control end of the first selecting transistor with the control voltage fixed to the second voltage level to limit the writing current to a second predetermined current value.

Based on the foregoing, according to the embodiments of the disclosure, the memory controller applies the control voltage to the control end of the first selecting transistor. As such, the writing current gradually changes to the predetermined current values during the resistance transition phases of the writing pulse width period, and the writing current is limited to one or more predetermined current values during the filament stabilization phases of the writing pulse width period. As a result, the BER can be effectively reduced.

BRIEF DESCRIPTION OF THE DRAWINGS

FIG. 7 is a flowchart of an operating method for a resistive memory storage apparatus according to an embodiment of the disclosure.

DESCRIPTION OF THE EMBODIMENTS

Several embodiments are presented below to illustrate the disclosure. However, the disclosure is not limited to the illustrated embodiments. Also, reasonable combinations are allowed among the embodiments. The term "coupled" used in the entire specification of the disclosure (including the claims) can refer to any direct or indirect connection means. For example, if it is described that the first device is coupled to the second device, it should be interpreted that the first device can be directly connected to the second device, or the first device can be indirectly connected to the second device through other devices or some kind of connection means.

Figure 1:
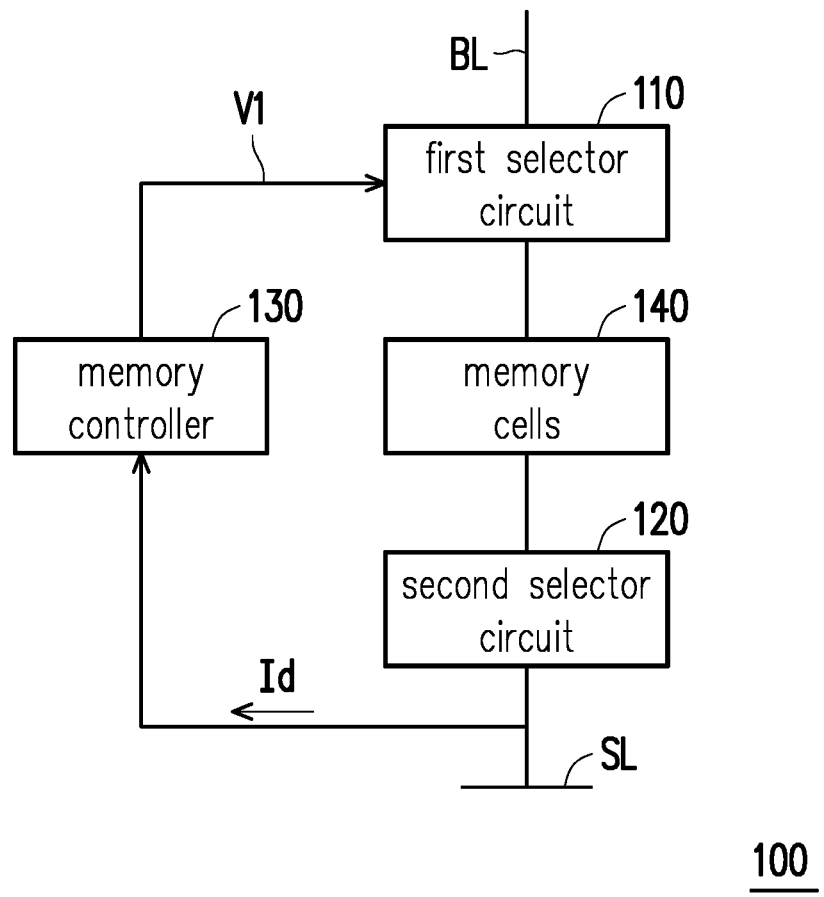
FIG. 1 is a schematic diagram of a resistive memory storage apparatus according to an embodiment of the disclosure.

FIG. 1 is a schematic diagram of a resistive memory storage apparatus according to an embodiment of the disclosure. As illustrated in FIG. 1, the resistive memory storage apparatus 100 in the embodiment includes a first selector circuit 110, a second selector circuit 120, a memory controller 130, and a memory array. The memory array includes multiple memory cells 140. In FIG. 1, merely one memory cell 140 is drawn as an example. The memory controller 130 is configured to provide a control voltage V1 to the first selector circuit 110 during a writing pulse width period. The writing pulse width period includes a resistance transition phase P0 and a subsequent filament stabilization phase P1 (marked in FIG. 3). That is, the filament stabilization phase P1 follows the resistance transition phase P0, and there is no time interval therebetween according to an exemplary embodiment. However, the disclosure provides no limitation to whether there is any time interval between the two phases. The writing pulse width period refers to the time required for certain data to be successfully written into the selected memory cell 140.

Figure 2A:
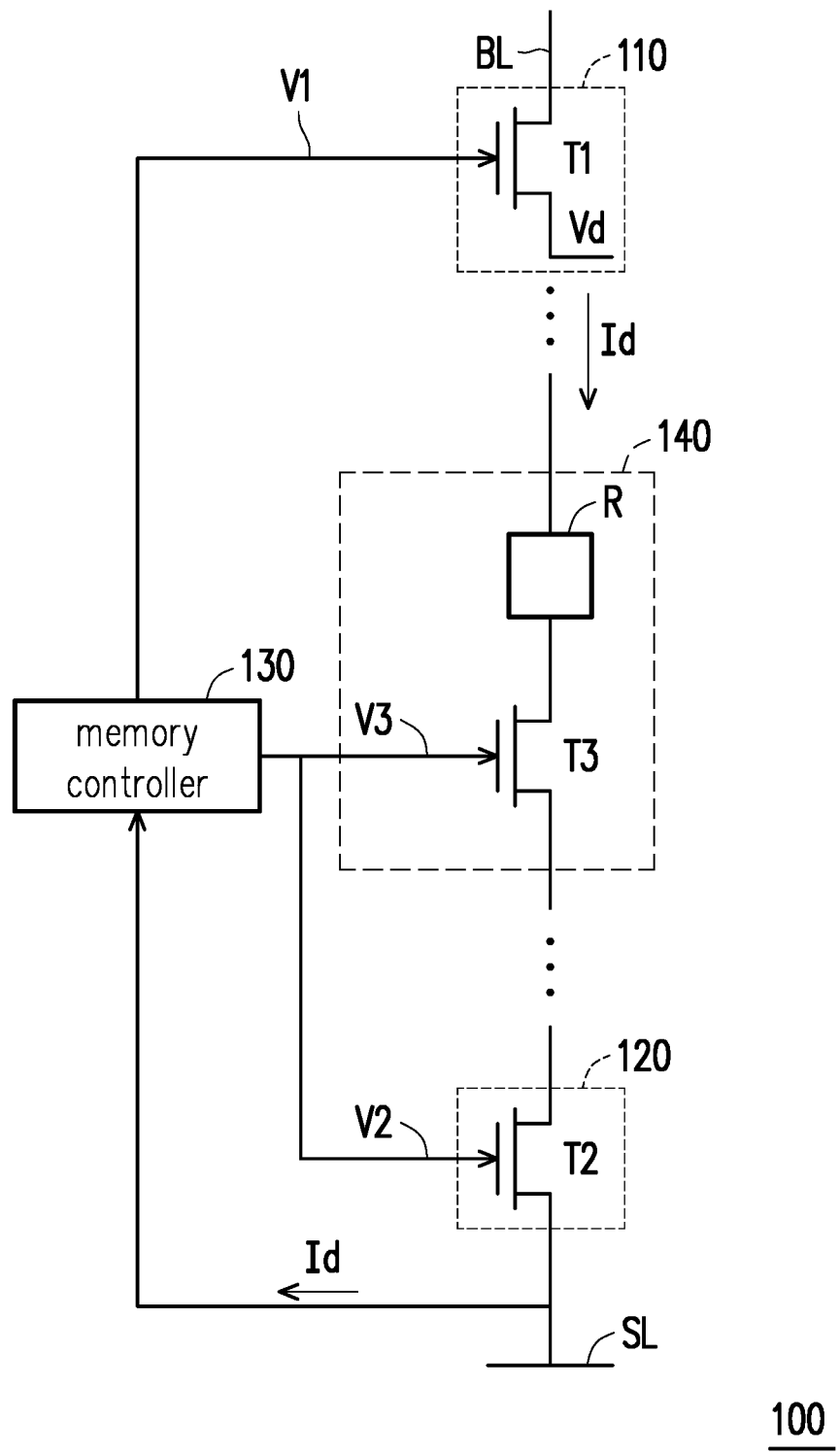
FIG. 2A is a schematic diagram of the resistive memory storage apparatus of FIG. 1.

FIG. 2A is a schematic diagram of the internal of the resistive memory storage apparatus of FIG. 1. Please refer to FIG. 1 and FIG. 2A, in which the memory cell 140 is characterized by a (1T1R) structure including a transistor T3 and a variable resistor R, or a (2T2R) structure including two transistors and two variable resistors, implementation of which is well known to a skilled person in the art, and is not further narrated herein. Note that, the structure of the memory cell 140 is not limited according to the disclosure.

According to the embodiment, the memory controller 130 can be a processor chip, a field-programmable gate array (FPGA) chip, a programmable controller, an application specific integrated circuit (ASIC), a programmable logic device (PLD), a device similar to these devices, a combination of these devices, or a circuit block other than these devices but functioning the same, implementation of which is well known to a skilled person in the art, and is not further narrated herein.

Specifically, one end of the memory cell 140 is coupled to a bit line BL through the first selector circuit 110, and the other end of the memory cell 140 is coupled to a source line SL through the second selector circuit 120. According to exemplary embodiments, the first selector circuit 110 and the second selector circuit 120 can be located in the same selector circuit block, or can be implemented by different circuit blocks, the disclosure is not limited thereto. During the writing pulse width period, a control end of the transistor T3 of the memory cell 140 is provided with a voltage V3 (also called as word line voltage), a control end of a second selecting transistor T2 is provided with a voltage V2, and the memory controller 130 provides the control voltage V1 to the first selector circuit 110. As such, the first selector circuit 110 provides a writing current Id to the memory cells 140 of the memory array, and the writing current Id is provided to a first end of the second selector circuit 120 through the memory cell 140. The memory controller 130 receives the writing current Id from a second end of the second selector circuit 120, and updates the control voltage V1 according to the writing current Id read from the second selector circuit 120 to output the updated control voltage V1 to the first selector circuit 110. As a result, the writing current Id which writes the memory cells 140 of the memory array to the same state changes to a predetermined current value during the resistance transition phase P0, and is limited to the same predetermined current value. The memory controller 130 is further configured to continuously provide the control voltage V1 to the first selector circuit 110 during the filament stabilization phase P1 after the writing current Id reaches the predetermined current value, so that the writing current Id continuously passes through the memory cell 140 during the filament stabilization phase P1.

The first selector circuit 110 includes one or more first selecting transistors T1, and the second selector circuit 120 includes one or more second selecting transistors T2. According to FIG. 2A, merely one selecting transistor is drawn in each of the selector circuits for illustration, but the number of the selecting transistor is not limited according to the disclosure. Specifically, the first end of the first selecting transistor T1 is coupled to the bit line BL, and the second end of the first selecting transistor T1 is coupled to the memory cell 140. The control end of the first selecting transistor T1 is coupled to the memory controller 130. The first end of the second selecting transistor T2 is coupled to the memory cell 140. The second end of the second selecting transistor T2 is coupled to the source line SL and the memory controller 130.

Figure 2B:
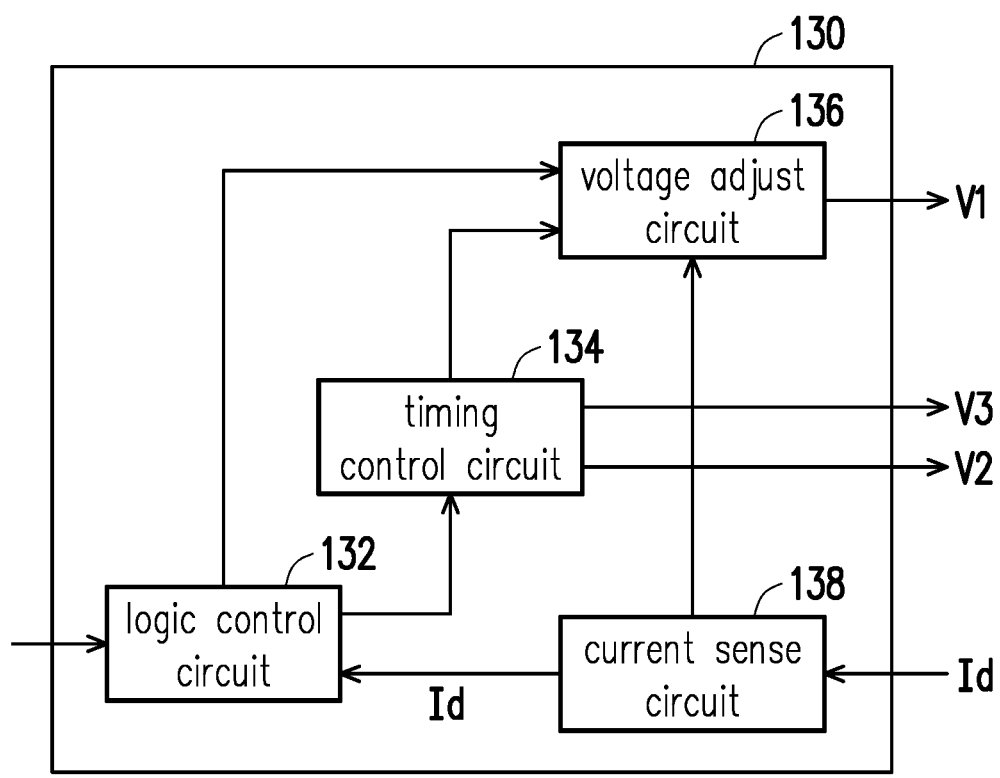
FIG. 2B is a block diagram of a memory controller of FIG. 2A.

FIG. 2B is a functional block diagram of the memory controller of FIG. 2A. As illustrated in FIG. 2B, the memory controller 130 in the embodiment includes a logic control circuit 132, a timing control circuit 134, a voltage adjust circuit 136 and a current sense circuit 138. The logic control circuit 132 functions as the core of the memory controller 130, and is configured to receive multiple setting values (such as the setting of the predetermined current value, the setting of the step number, and the setting of the length of time of the filament stabilization phase). In addition, the logic control circuit 132 is configured to compare the writing current Id output from the current sense circuit 138, and control the operations of the timing control circuit 134 and the voltage adjust circuit 136 according to the writing current Id and the setting values. The voltage adjust circuit 136 is configured to adjust and output the control voltage V1 according to the writing current Id, the output of the logic control circuit 132 and the output of the timing control circuit 134. The timing control circuit 134 is configured to control the feedback timing and control timing of the signals. The current sense circuit 138 is configured to detect the writing current Id and outputting the writing current Id to the logic control circuit 132. According to an exemplary embodiment, the voltage adjust circuit 136 and the current sense circuit 138 are analog.

Figure 3:
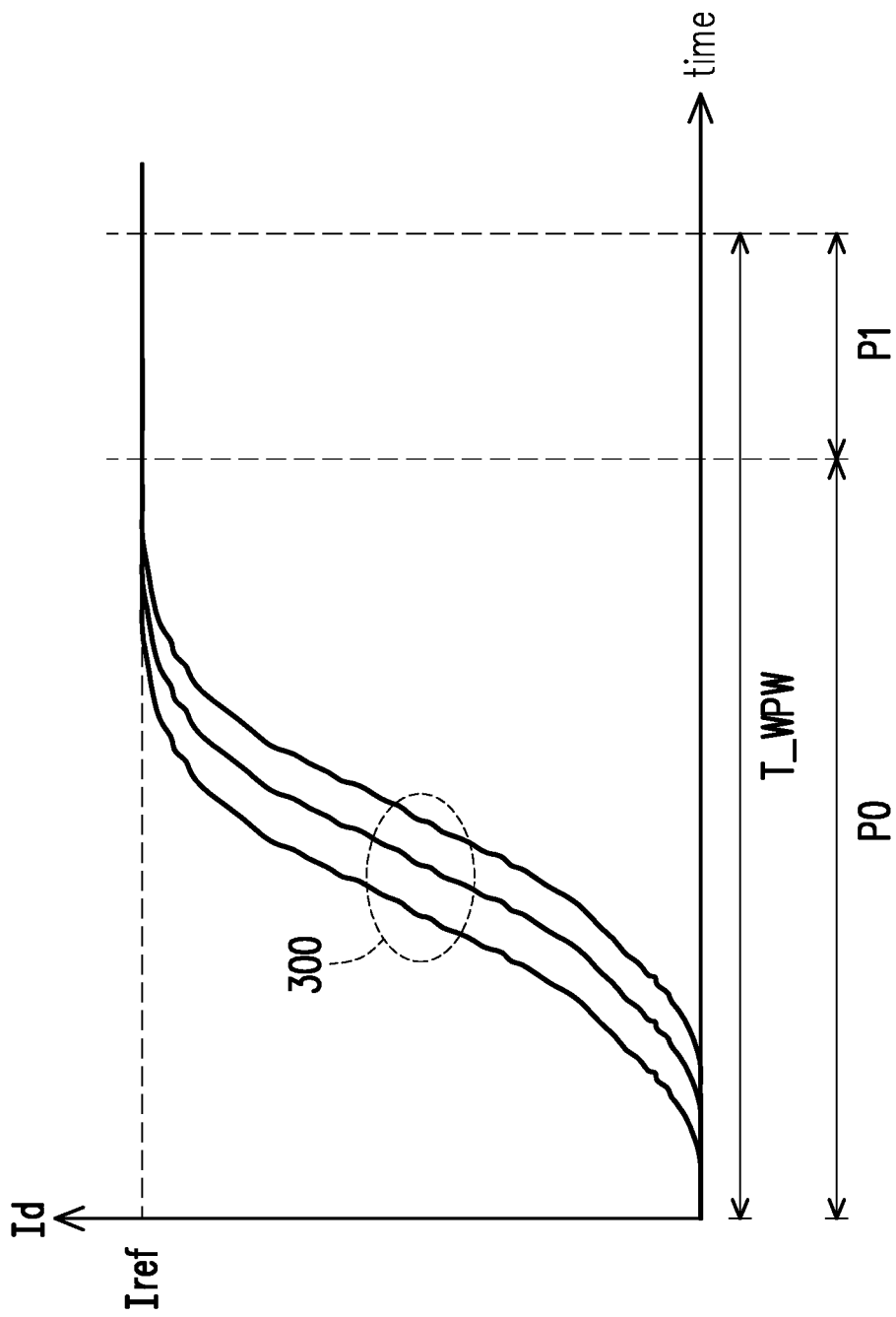
FIG. 3 is a schematic diagram of waveforms of a writing current during a writing pulse width period according to an embodiment of the disclosure.
Figure 6:
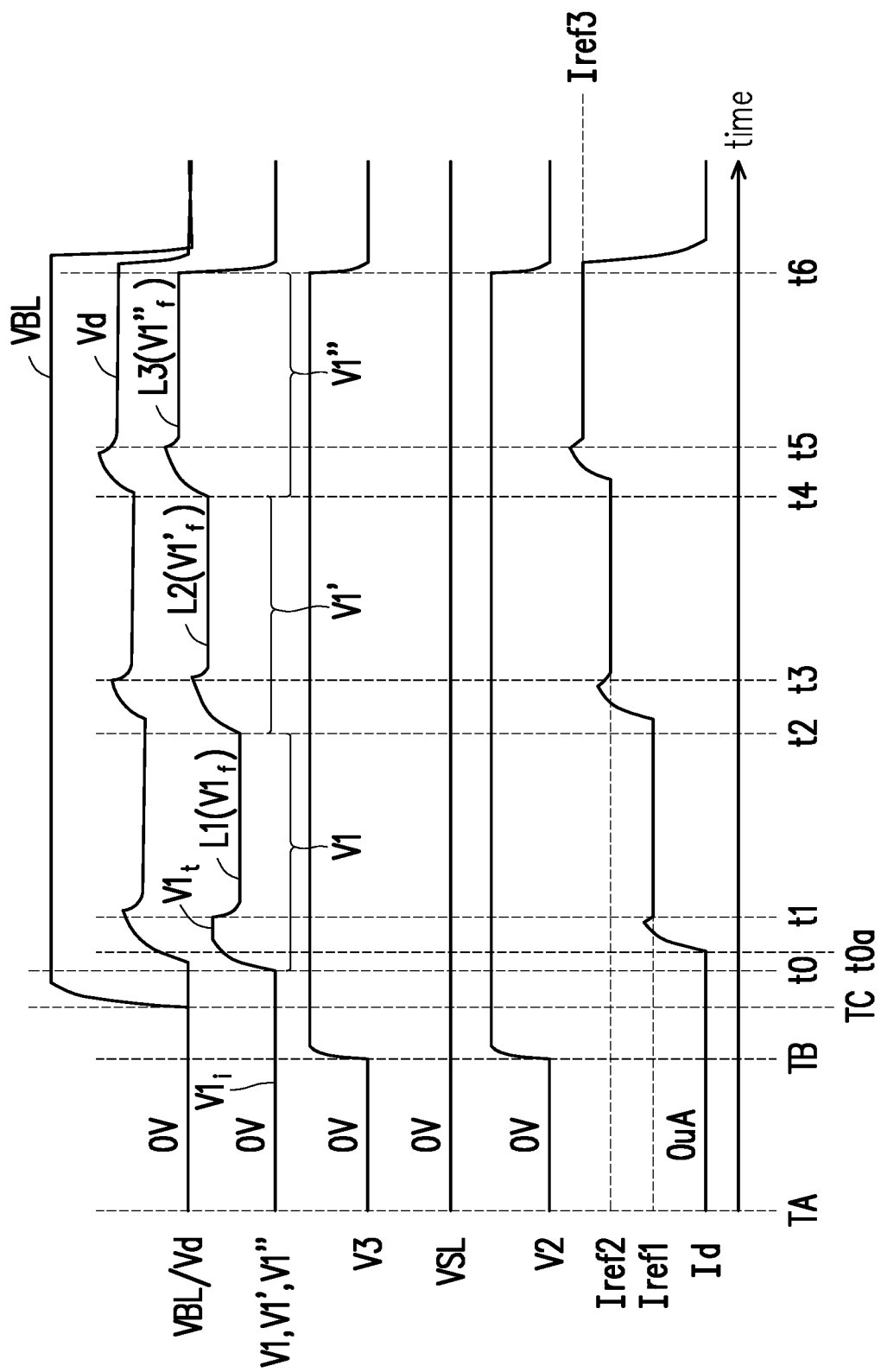
FIG. 6 is a schematic diagram illustrating voltage and current waveforms of a resistive memory storage apparatus according to an embodiment of the disclosure.

FIG. 3 is a schematic diagram of waveforms of the writing current during the writing pulse width period according to an embodiment of the disclosure. In the embodiment, during the writing pulse width period T_WPW, the memory controller 130 provides an initial control voltage $V1_i$ to the first selector circuit 110, so that the first selector circuit 110 provides the writing current Id to the memory cells 140 of the memory array. The resistance value of each of the memory cells 140 varies in response to the writing current Id. The memory controller 130 reads the writing current Id from the memory cell 140, and applies the updated control voltage V1 to the control end of first selecting transistor T1 according to the writing current Id read from the memory cell 140. After the writing current Id which writes the memory cells 140 of the memory array to the same state exceeds a predetermined current value Iref, the memory controller 130 sets the corresponding control voltage V1 to a fixed control voltage $V1_f$, and continuously provides the fixed control voltage $V1_f$ to the control end of the first selecting transistor T1 during the filament stabilization phase P1. As such, the writing current Id of the memory cells 140 is limited to the predetermined current value Iref during the filament stabilization phase P1, so as to complete the write operation. According to the embodiment, during the resistance transition phase P0, the control voltage V1 provided by the memory controller 130 gradually increases from the initial control voltage $V1_i$ to the fixed control voltage $V1_f$, so that the current read from the respective memory cell 140 (i.e. the writing current Id) gradually increases with the control voltage V1. According to an embodiment, as shown in FIG. 6, during the resistance transition phase P0, the control voltage V1 provided by the memory controller 130 gradually increases from the initial control voltage $V1_i$ to a final control voltage $V1t$ greater than the fixed control voltage $V1_f$. As such, the current read by the respective memory cell 140 (i.e. the writing current Id) gradually increases with the increase of the control voltage V1, so as to be greater than the predetermined current value Iref. And, after reaching the final control voltage $V1t$, the control voltage V1 provided by the memory controller 130 gradually decreases to the fixed control voltage $V1_f$. As a result, the current read from the respective memory cell 140 (i.e. the writing current Id) decreases with the decrease of the control voltage V1, so as to be equal to the predetermined current value Iref.

In a practical situation, after the forming operation or the setting operation is performed on the memory cell, an uneven distribution of the cell currents may appear and result in a high bit error rate (BER). The uneven distribution is caused by manufacturing process variations of the memory cells. In addition, due to the manufacturing process variations, the writing currents 300 read from different memory cells are different during the writing pulse width period T_WPW, as shown in FIG. 3. According to the embodiment of the disclosure, by limiting the writing currents Id which write the memory array to the same state to the predetermined current value Iref, the cell current distribution can be more uniform. In addition, by continuously providing the fixed control voltage $V1_f$ to the control end of first selecting transistor T1 during the filament stabilization phase P1, the conductive filament structure of the memory cells are enhanced to be more robust, so as to effectively reduce the BER. Moreover, according to the embodiment, the memory controller can complete the writing operation without a verification operation, that is, a writing verification operation is not performed during the writing pulse width period, so that the time required for writing can be shortened.

Figure 4:
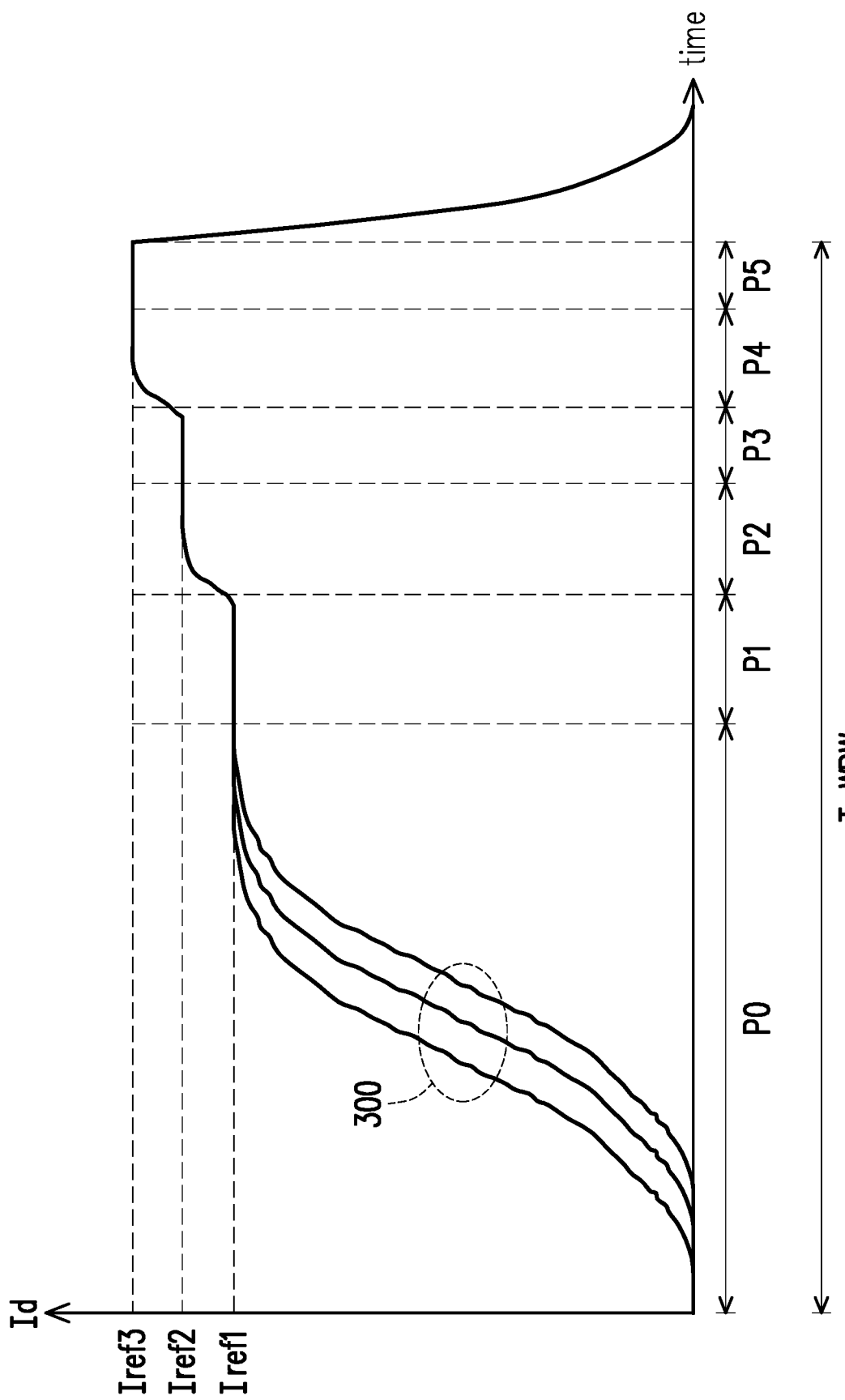
FIG. 4 is a schematic diagram of waveforms of the writing current during the writing pulse width period according to an alternative embodiment of the disclosure.

FIG. 4 is a schematic diagram of waveforms of the writing current during the writing pulse width period according to an alternative embodiment of the disclosure. In the embodiment, the writing pulse width period T_WPW includes multiple resistance transition phases and subsequent filament stabilization phases. The memory controller 130 provides the increasing control voltage V1 to the control end of the first selecting transistor T1 during each of the resistance transition phases, and the initial control voltage of the previous resistance transition phase is smaller than the initial control voltage of the next resistance transition phase. As such, the writing current Id gradually increases from a predetermined current value Iref1 to predetermined current values Iref2 and Iref3. Note that, the predetermined current value Iref3 is greater than the predetermined current value Iref2, and the predetermined current value Iref2 is greater than the predetermined current value Iref1. The number of the aforementioned predetermined current values is not limited according to the disclosure.

For example, the writing pulse width period T_WPW includes resistance transition phases P0, P2, P4 and subsequent filament stabilization phases P1, P3, P5 following the resistance transition phase. The memory controller 130 provides the increasing control voltage V1 to the control end of the first selecting transistor T1 during the resistance transition phase P0, so that the writing current Id gradually increases to the predetermined current value Iref1 during the resistance transition phase P0, and is finally limited to the predetermined current value Iref1 (first predetermined current value). Next, as shown in FIG. 6, the memory controller 130 provides the fixed control voltage $V1_f$ to the control end of the first selecting transistor T1 during the filament stabilization phase P1, so that the writing current Id is maintained at the predetermined current value Iref1 during the filament stabilization phase P1. Note that, the length of the filament stabilization phase P1 is shorter than the length of the resistance transition phase P0. Next, the memory controller 130 provides an increasing control voltage V1' to the control end of the first selecting transistor T1 during the resistance transition phase P2, so that the writing current Id gradually increases to the predetermined current value Iref2 during the resistance transition phase P2, and is finally limited to the predetermined current value Iref2 (second predetermined current value). Next, as shown in FIG. 6, the memory controller 130 provides a fixed control voltage $V1'_f$ to the control end of the first selecting transistor T1 during the filament stabilization phase P3, so that the writing current Id is maintained at the predetermined current value Iref2 during the filament stabilization phase P3. Note that, the predetermined current value Iref2 is greater than the predetermined current value Iref1. Also, the length of the filament stabilization phase P3 is shorter than the length of the resistance transition phase P2. Similarly, the memory controller 130 provides an increasing control voltage V1" to the control end of the first selecting transistor T1 during the resistance transition phase P4, so that the writing current Id gradually increases to the predetermined current value Iref3 during the resistance transition phase P4, and is finally limited to the predetermined current value Iref3 (third predetermined current value). Next, as shown in FIG. 6, the memory controller 130 provides a fixed control voltage V1"$_f$ to the control end of the first selecting transistor T1 during the filament stabilization phase P5, so that the writing current Id is maintained at the predetermined current value Iref3 during the filament stabilization phase P5. Note that, the predetermined current value Iref3 is greater than the predetermined current value Iref2. Also, the length of the filament stabilization phase P5 is shorter than the length of the resistance transition phase P4.

Figure 5:
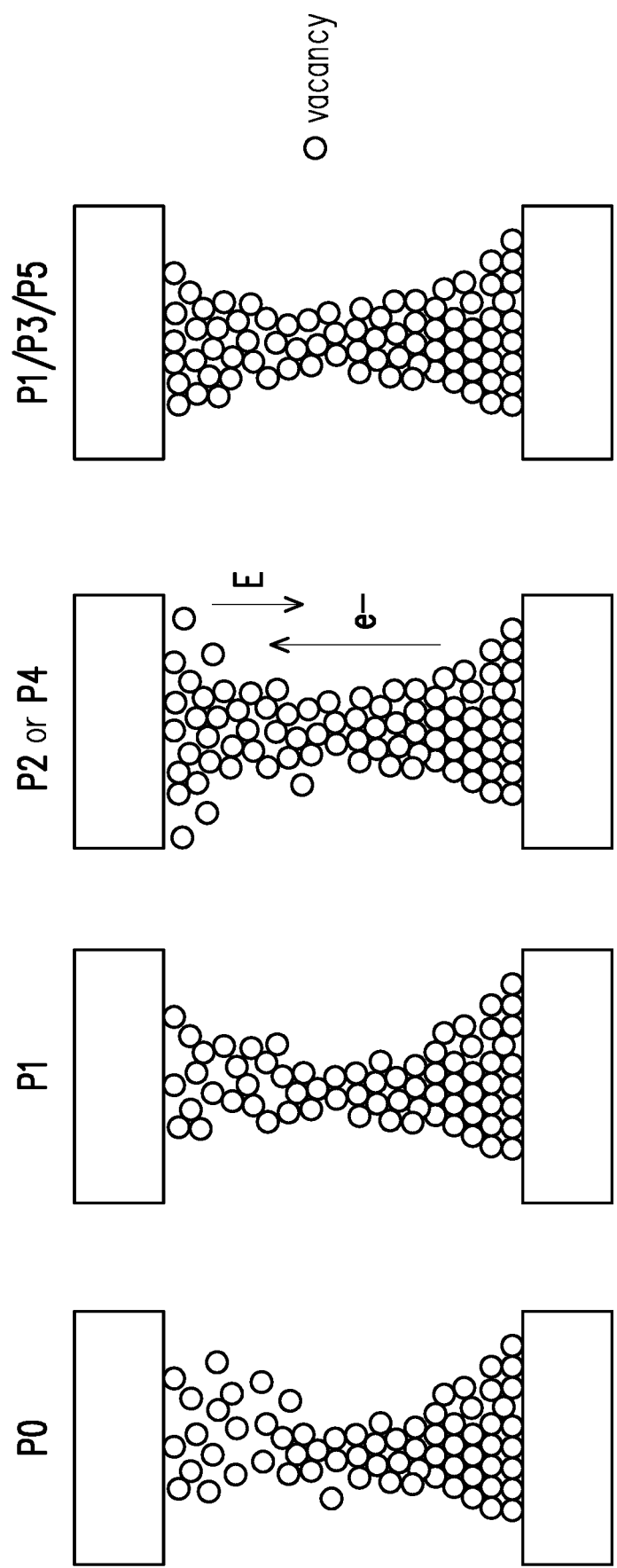
FIG. 5A, FIG. 5B, FIG. 5C and FIG. 5D are schematic diagrams illustrating filament structures of memory cells at different stages according to an embodiment of the disclosure.

FIG. 5A to FIG. 5D are schematic diagrams illustrating filament distributions of the memory cells at different stages according to an embodiment of the disclosure. As shown in FIG. 4 and FIG. 5A to FIG. 5D, during the resistance transition phase P0, transitions occur in the memory cells 140. For example, please refer to FIG. 5A, in which the transition is from a high resistance state (HRS) to a low resistance state (LRS), and the filament distribution is relatively loose. After the transition, the memory controller 130 continuously applies the fixed control voltage V1$_f$ to the control end of the first selecting transistor T1, so that the writing current Id is limited to the predetermined current value Iref1 during the filament stabilization phase P1, and thereby the filament distribution of the memory cells 140 changes to a stabilization state during the filament stabilization phase P1, as shown in FIG. 5B. Next, during the resistance transition phase P2, by providing the increasing control voltage V1' to the control end of the first selecting transistor T1, the filament in the loose state is rebuilt or restored, as shown in FIG. 5C. In FIG. 5C, E represents the direction of the electric field, and e– represents the movement direction of electron. Next, during the filament stabilization phase P3, by continuously applying the fixed control voltage V1'$_f$ to the control end of the first selecting transistor T1, the filament distribution of the memory cells 140 become stable again, as shown in FIG. 5D.

Similarly, during the resistance transition phase P4, the filament distribution of the memory cells 140 is in a relatively loose state. During the filament stabilization phase P5, the filament distribution of the memory cells 140 becomes stable again. That is to say, according to the embodiment, by applying the stepping control voltages V1, V1', V1" to the control end of the first selecting transistor T1, the writing current Id gradually increases to the predetermined current values Iref1, Iref2, Iref3 during the respective resistance transition phases P0, P2, P4, and is respectively limited to the predetermined current values Iref1, Iref2, Iref3 during the filament stabilization phases P1, P3, P5. In this way, the memory cells 140 are repeatedly switched between the loose and stable states of the filament distribution, which can enhance the filament to be more robust, and can more uniformly distribute the cell currents, so as to reduce the BER.

In the embodiment of FIG. 4, the predetermined current values varies in the three-step, however the disclosure is not limited to this. The number and size of the predetermined current values can be adjusted based on practical design requirements. For example, in the embodiment of FIG. 3, the memory controller 130 merely limits the writing current Id to the predetermined current value Iref, which is a one-step process.

FIG. 6 is a schematic diagram illustrating voltage and current waveforms of the resistive memory storage apparatus according to an embodiment of the disclosure. Please refer to FIG. 2A and FIG. 6. In FIG. 6, the voltages V1, V1', V1" are the control voltages applied to the control end of first selecting transistor T1, the voltage V2 is another control voltage applied to the control end of the second selecting transistor T2 voltage, and the voltage V3 is the word line voltage applied to the control end of the transistor T3 of the memory cell 140. Voltages VBL and VSL are the respective voltages applied to the bit line BL and the source line SL. The voltages V2, V3, VBL, VSL can be provided by the memory controller 130 or other memory controllers or power suppliers of the memory storage apparatus 100. A voltage Vd is the voltage of the second end of the first selecting transistor T1.

At a time point TA, the memory storage apparatus 100 is in an initial state, and the voltages V1, V2, V3, VBL, VSL are all 0 volts. At a time point TB, the voltages V2 and V3 are pulled high to simultaneously turn on the second selecting transistor T2 and transistor T3, and enable the second selecting transistor T2 and transistor T3 to be fully ON. For example, apply the high voltage V2 to the control end of second selecting transistor T2, and apply a low voltage (such as a ground voltage) to the source line SL to fully turn on second selecting transistor T2. In addition, the word line voltage V3 with high potential is applied to the control end of the transistor T3 of the memory cell 140 to fully turn on the transistor T3 of the memory cell 140. At a time point TC, the voltage VBL is pulled high to pull the voltage of the first end of first selecting transistor T1 to the voltage VBL. The level of the voltage VBL can be set higher to avoid clamping the writing current Id.

At a time point t0, according to the predetermined current value Iref1, the memory controller 130 applies the increasing control voltage V1 to the control end of the first selecting transistor T1, so that the first selecting transistor T1 is turned on. From a time point t0a to a time point t1 (resistance transition phase), a transition occurs in the memory cell 140 according to the control voltage V1 and the voltage VBL, and at the time point t1, the memory controller 130 reduces the control voltage V1 to a fixed first voltage level L1, so that the writing current Id is limited to the predetermined current value Iref1, which is maintained until a time point t2. In order to stabilize the filament, the time length that the fixed first voltage level L1 is applied (filament stabilization phase) can be adjusted based on practical requirements. According to an exemplary embodiment, the interval between the time point t0 and the time point t1 are picoseconds. According to an exemplary embodiment, the length of the filament stabilization phase (i.e. the time length that the fixed first voltage level L1 is applied) is greater than the length of the resistance transition phase (i.e. the interval between the time point t0a and the time point t1).

At the time point t2, according to the predetermined current value Iref2, the memory controller 130 gradually increases the control voltage V1' to be greater than a second voltage level L2. Note that, in the embodiment, the predetermined current value Iref2 is greater than the predetermined current value Iref1, and the second voltage level L2 is greater than the first voltage level L1. The interval between the time point t2 to a time point t3 is the resistance transition phase, in which the filament is loose and waits for reconstruction or recovery.

Similarly, from the time point t3 to a time point t4, the control voltage V1' reduces to the fixed second voltage level L2, so that the writing current Id is limited to the predetermined current value Iref2, and the memory cell 140 is stable again. Similarly, from the time point t4 to a time point t5 (resistance transition phase), the memory controller 130 gradually increases the control voltage V1" to be greater than a third voltage level L3 according to the predetermined current value Iref3, and the filament of the memory cell 140 is loose again. From the time point t5 to a time point t6, the control voltage V1" reduces to the fixed third voltage level L3, so that the writing current Id is limited to the predetermined current value Iref3, and the memory cell 140 is stable again. Note that, the predetermined current value Iref3 is greater than the predetermined current value Iref2, and the third voltage level L3 is greater than the second voltage level L2. That is to say, in the embodiment, the control voltages V1, V1', V1" are step voltages which gradually increase over time from the first voltage level L1 to the second voltage level L2, and then increase to the third voltage level L3 in sequence.

FIG. 7 is a flowchart of an operating method for a resistive memory storage apparatus according to an embodiment of the disclosure. Please refer to FIG. 2A, FIG. 4, FIG. 6 and FIG. 7. The operating method of the exemplary embodiment is at least applicable to the resistive memory storage apparatus 100 of FIG. 2A, but the disclosure is not limited thereto. Taking the resistive memory storage apparatus 100 of FIG. 2A as an example, in a step S100, during the first resistance transition phase of the writing pulse width period, the memory controller 130 provides the control voltage V1 which gradually changes to the first voltage level L1 to the control end of the first selecting transistor T1, and during the subsequent first filament stabilization phase, the memory controller 130 provides the fixed first voltage level L1 to the control end of the first selecting transistor T1, so that the writing current Id is limited to the first predetermined current value Iref1. In a step S10, during the second resistance transition phase of the writing pulse width period, the memory controller 130 provides the control voltage V1 which gradually changes to the second voltage level L2 to the control end of the first selecting transistor T1, and during the subsequent second filament stabilization phase, the memory controller 130 provides the fixed second voltage level L2 to the control end of the first selecting transistor T1, so that the writing current Id is limited to the second predetermined current value Iref2. Note that, the second voltage level L2 is greater than the first voltage level L1, and the second predetermined current value Iref2 is greater than the first predetermined current value Iref1.

In addition, the description of the embodiments of FIG. 1 to FIG. 6 can provide sufficient teaching, suggestion and implementation directions for other details of the operating method of the resistive memory storage apparatus in the embodiment of the disclosure. Therefore, the details will not be repeated again. Moreover, the operating method of the resistive memory storage apparatus in the embodiment of the disclosure at least can be applied to a single-level cell (SLC) memory storage apparatus or a multi-level cell (MLC) memory storage apparatus, which is not limited according to the disclosure. The operating method of the resistive memory storage apparatus in the embodiment of the disclosure can further be applied to a one-time programmable (OTP) memory storage apparatus or a multi-time programmable (MTP) memory storage apparatus, which is not limited according to the disclosure.

To sum up, according to the embodiments of the disclosure, the memory controller applies the control voltage to the control end of the first selecting transistor. As such, the writing current gradually changes to the predetermined current values during the resistance transition phases of the writing pulse width period, and the writing current is limited to one or more predetermined current values during the filament stabilization phases of the writing pulse width period. By limiting the writing current to one or more predetermined current values during the filament stabilization phases, the cell current distribution is improved to be more uniform, and the conductive filament structure of the memory cells is improved to be more robust, so as to effectively reduce the BER.

Although the disclosure is described with reference to the above embodiments, the embodiments are not intended to limit the disclosure. A skilled person in the art may make variations and modifications without departing from the spirit and scope of the disclosure. Therefore, the protection scope of the disclosure should be subject to the appended claims.

What is claimed is:

1. A resistive memory storage apparatus, comprising:
   a memory array, comprising a plurality of memory cells, wherein each of the plurality of memory cells outputs a writing current during a writing pulse width period;
   a first selecting transistor, coupled to the plurality of memory cells, wherein the first selecting transistor comprises a control end; and
   a memory controller, coupled to the selecting transistor and the plurality of memory cells, configured to apply a first control voltage gradually changing to a first voltage level according to the writing current to the control end of the first selecting transistor during a first resistance transition phase of the writing pulse width period, and set the first control voltage to the first voltage level during a first filament stabilization phase after the first resistance transition phase, so as to limit the writing current to a first predetermined current value.

2. The resistive memory storage apparatus of claim 1, wherein the writing pulse width period comprises a plurality of resistance transition phases and a plurality of filament stabilization phases, and the writing current is limited to the corresponding predetermined current value during each of the plurality of filament stabilization phases.

3. The resistive memory storage apparatus of claim 2, wherein the plurality of resistance transition phases comprise the first resistance transition phase and a second resistance transition phase after the first filament stabilization phase, the plurality of filament stabilization phases comprise the first filament stabilization phase and a second filament stabilization phase after the second resistance transition phase, the memory controller is configured to gradually change the first control voltage to the first voltage level during the first resistance transition phase, and to gradually change the first control voltage to a second voltage level during the second resistance transition phase, and is configured to set the first control voltage to the second voltage level during the second filament stabilization phase, wherein the second voltage level is greater than the first voltage level.

4. The resistive memory storage apparatus of claim 3, wherein the memory controller is configured to gradually increase the first control voltage from an initial control voltage to a final control voltage during the first resistance transition phase, and the final control voltage is greater than the first voltage level.

5. The resistive memory storage apparatus of claim 3, wherein the writing current is limited to a second predetermined current value greater than the first predetermined current value during the second filament stabilization phase.

6. The resistive memory storage apparatus of claim 1, further comprising a second selecting transistor coupled to the plurality of memory cells and the memory controller,
wherein the second selecting transistor comprises a first end, a second end and a control end, the first end of the second selecting transistor is coupled to the plurality of memory cells, the second end of the second selecting transistor is coupled to a source line, and the writing current is output from the second end of the second selecting transistor to the memory controller,
wherein the first selecting transistor further comprises a first end and a second end, the first end of the first selecting transistor is coupled to a bit line, the second end of the first selecting transistor is coupled to the plurality of memory cells, and the first selecting transistor provides the writing current to one of the plurality of memory cells according to the first control voltage,
wherein each of the plurality of memory cells comprises a transistor and a variable resistor,
wherein the memory controller is configured to provide the second selecting transistor with a first saturation voltage for fully turning on the second selecting transistor during the writing pulse width period, and provide the transistor with a second saturation voltage for fully turning on the transistor during the writing pulse width period.

7. The resistive memory storage apparatus of claim 6, wherein the memory controller comprises:
a logic control circuit, configured to receive a setting of the first predetermined current value, a setting of the length of the first filament stabilization phase, and receive the writing current;
a timing control circuit, configured to output a second control voltage applied to the control end of the second selecting transistor, and output a third control voltage applied to a control end of the transistor;
a voltage adjust circuit, configured to update a voltage level of the first control voltage according to the output of the logic control circuit, the output of the timing control circuit and the writing current, and output the updated first control voltage to the control end of the first selecting transistor; and
a current sense circuit, configured to detect the writing current and output the writing current to the logic control circuit.

8. The resistive memory storage apparatus of claim 1, wherein the memory controller is configured to set the length of the first filament stabilization phase to be shorter than the length of the first resistance transition phase.

9. The resistive memory storage apparatus of claim 1, wherein the memory controller is configured to set the length of the first filament stabilization phase to be longer than the length of the first resistance transition phase.

10. The resistive memory storage apparatus of claim 1, wherein the memory controller is configured to complete a writing operation during the writing pulse width period without a verification operation.

11. An operating method for a resistive memory storage apparatus, wherein the resistive memory storage apparatus comprises a plurality of memory cells and a first selecting transistor coupled to the plurality of memory cells, the operation method comprising:
during a writing pulse width period, reading a writing current from one of the plurality of memory cells, wherein the writing pulse width period comprises a plurality of resistance transition phases and a plurality of filament stabilization phases, the plurality of resistance transition phases comprise a first resistance transition phase and a second resistance transition phase, and the plurality of filament stabilization phases comprise a first filament stabilization phase and a second filament stabilization phase;
during the first resistance transition phase, providing a control end of the first selecting transistor with a control voltage gradually changing to a first voltage level according to the writing current to provide the writing current to one of the plurality of memory cells;
during the first filament stabilization phase after the first resistance transition phase, providing the control end of the first selecting transistor with the control voltage fixed to the first voltage level to limit the writing current to a first predetermined current value;
during the second resistance transition phase after the first filament stabilization phase, providing the control end of the first selecting transistor with the control voltage gradually changing to a second voltage level greater than the first voltage level according to the writing current; and
during the second filament stabilization phase after the second resistance transition phase, providing the control end of the first selecting transistor with the control voltage fixed to the second voltage level to limit the writing current to a second predetermined current value.

12. The operating method of claim 11, wherein the resistive memory storage apparatus further comprises a second selecting transistor, and each of the plurality of memory cells is disposed between the first selecting transistor and the second selecting transistor, the operating method further comprising:
during the writing pulse width period, providing the second selecting transistor with a first saturation voltage for fully turning on the second selecting transistor, and providing a transistor of one of the plurality of memory cells with a second saturation voltage for fully turning on the transistor during the writing pulse width period.

13. The operating method of claim 11, wherein the step of providing the control end of the first selecting transistor with the control voltage gradually changing to the first voltage level according to the writing current comprises:
during the first resistance transition phase, gradually increasing the control voltage from an initial control voltage to a final control voltage, wherein the final control voltage is greater than the first voltage level.

14. The operating method of claim 11, wherein the second predetermined current value is greater than the first predetermined current value.

15. The operating method of claim 11, further comprising:
setting the first predetermined current value, the second predetermined current value, the length of the first filament stabilization phase and the number of the plurality of resistance transition phases, wherein the length of the first filament stabilization phase is shorter than the length of the first resistance transition phase.

16. The operating method of claim 11, further comprising:
setting the first predetermined current value, the second predetermined current value, the length of the first filament stabilization phase and the number of the plurality of resistance transition phases, wherein the length of the first filament stabilization phase is longer than the length of the first resistance transition phase.

17. The operating method of claim 11, wherein a verification operation is not performed during the writing pulse width period.

\* \* \* \* \*